United States Patent [19]

Llewellyn

[11] Patent Number: 4,546,307
[45] Date of Patent: Oct. 8, 1985

[54] NPN TRANSISTOR CURRENT MIRROR CIRCUIT

[75] Inventor: William D. Llewellyn, San Jose, Calif.

[73] Assignee: National Semiconductor Corporation, Santa Clara, Calif.

[21] Appl. No.: 567,713

[22] Filed: Jan. 3, 1984

[51] Int. Cl.[4] .............................................. H03F 3/45
[52] U.S. Cl. ..................................... 323/315; 330/257
[58] Field of Search ................................ 323/315–317, 323/312; 330/257, 288

[56] References Cited

U.S. PATENT DOCUMENTS

| | | | |
|---|---|---|---|
| 3,925,718 | 12/1975 | Wittlinger | 323/315 |
| 4,100,436 | 7/1978 | van de Plessche | 323/315 |
| 4,158,178 | 6/1979 | Schade | 323/315 |

FOREIGN PATENT DOCUMENTS 207119  12/1983  Japan ................................ 323/312

OTHER PUBLICATIONS

Ellis, "Current Regulated Reference Diode", IBM Tech. Discl. Bul., vol. 15, No. 8, p. 2478, Jan. 1973.

Primary Examiner—William H. Beha, Jr.
Attorney, Agent, or Firm—Gail W. Woodward; Paul J. Winters; Michael J. Pollock

[57] ABSTRACT

A current mirror using NPN transistors is described for use in PN junction isolated monolithic integrated circuits. A preferred embodiment operates at high accuracy over a wide range of output currents. It also operates at a relatively high signal frequency. An application in a charge pump, suitable for use in a digital phase locked loop, is detailed.

6 Claims, 5 Drawing Figures

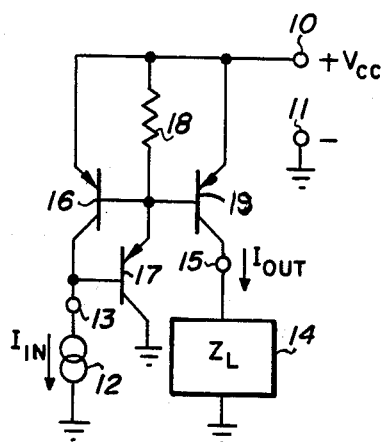
Fig_1 (PRIOR ART)
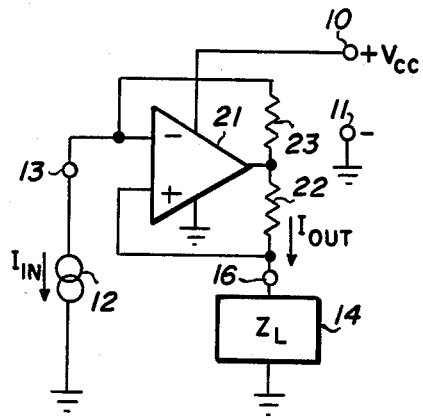
Fig_2
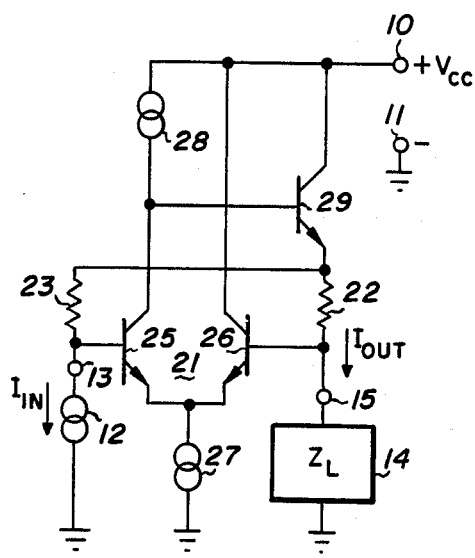
Fig_3

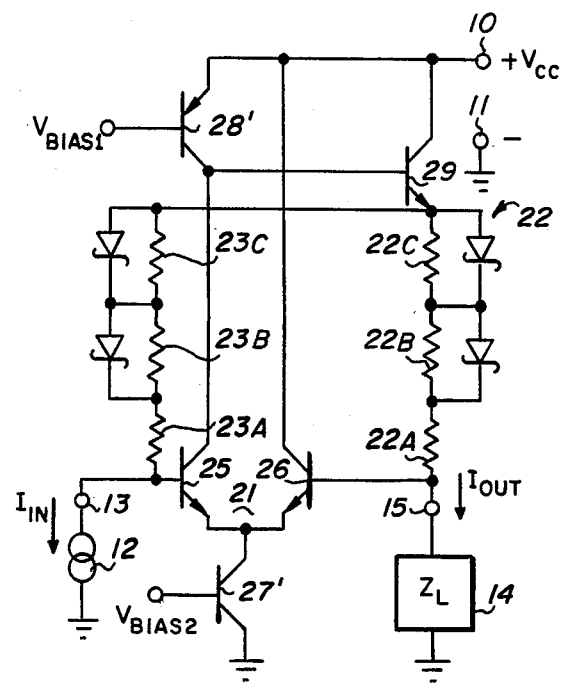
Fig_4
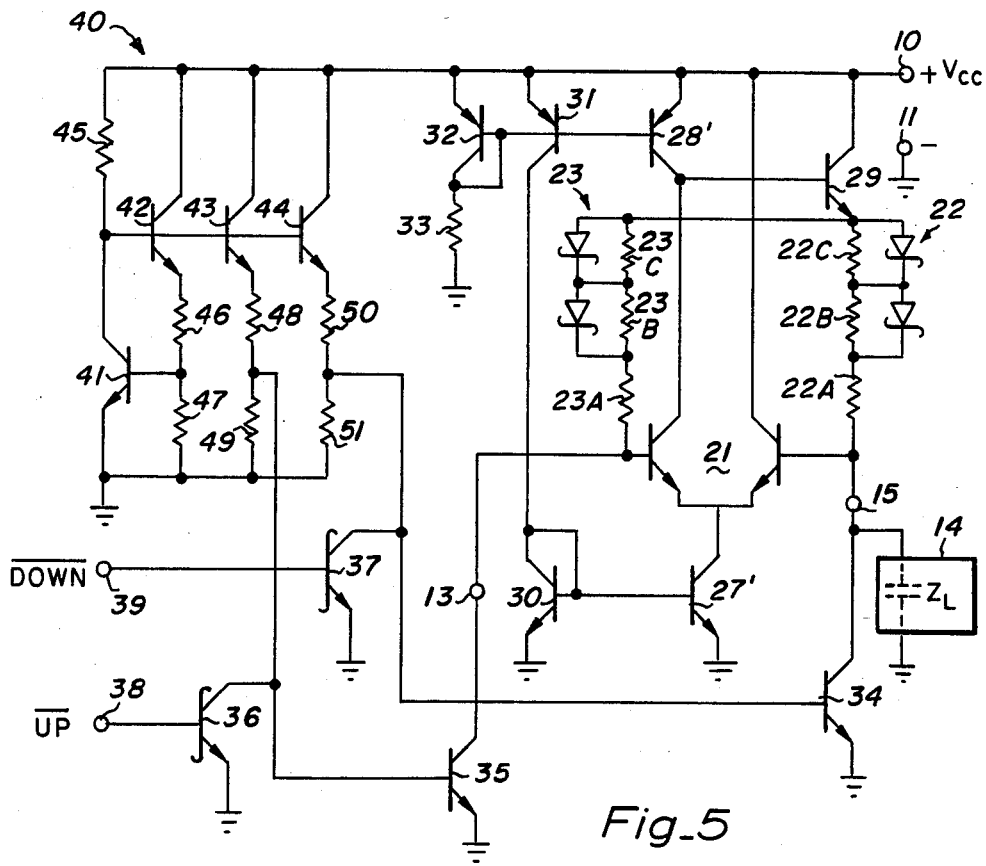
Fig_5

NPN TRANSISTOR CURRENT MIRROR CIRCUIT

BACKGROUND OF THE INVENTION

In the design of monolithic integrated circuit (IC) devices using PN junction isolation, lateral PNP transistors are commonly employed. However, since the current gain or Beta of such PNP transistors is intrinsically low and falls off at high frequencies, their use as signal amplifiers is restricted. In particular, IC current mirrors commonly employ PNP transistor current sources. For example in copending application Ser. No. 507,309 filed June 23, 1983, now U.S. Pat No. 4,528,496, by Toyojiro Naokawa and Matsuro Koterasawa a Low voltage IC current supply is described. The teaching in this application, which is assigned to the assignee of the present invention, is incorporated herein by reference. Such current mirros can be made to operate accurately at low voltages and they serve usefully as bias supplies. However, when a current mirror is intended to operate at signal frequencies, the PNP transistor frequency limitations can be significant.

In the conventional PN junction isolated monolithic IC, the NPN transistors display one to two orders of magnitude higher frequency response. This means that where signals are to be handled, NPN transistor construction is greatly preferred.

SUMMARY OF THE INVENTION

It is an object of the invention to provide an IC current mirror circuit using NPN transistors.

It is a further object of the invention to provide an IC current mirror using a differential amplifier as its basis.

It is a still further object of the invention to employ a differential amplifier to force a load sink current to follow a current sink input using only NPN active transistors.

These and other objects are achieved in the following manner. A differential transistor pair is coupled to drive an emitter follower output stage in the conventional manner. A resistor is coupled from the emitter follower output to each of the differential pair inputs. The noninverting input is coupled to the output load and the inverting input is coupled to a current sink input. The circuit will act to force the input differential voltage to zero at which point the output sources current to match the current sunk at the input. Where the two resistors are equal, the output current will mirror the input current. Where a wide dynamic range is desired, the resistors can be made non-linear as a function of current. This is ordinarily done by connecting several resistors in series and connecting diodes in shunt with all but one resistor. As the current rises the diodes become forward biased and thereby short out the associated shunt connected resistor.

BRIEF DESCRIPTION OF THE DRAWING

FIG. 1 is a schematic diagram of a super diode prior art current mirror circuit.

FIG. 2 is a block diagram of the circuit of the invention.

FIG. 3 is a schematic diagram of an implementation of the circuit of FIG. 2.

FIG. 4 is a schematic diagram of an implementation of the circuit of FIG. 2 with improved dynamic current range.

FIG. 5 is a schematic diagram of a charge pump circuit showing a digitally controlled capacitor load charge-discharge arrangement.

DESCRIPTION OF THE PRIOR ART

FIG. 1 is a schematic diagram of a widely used current mirror circuit known as a super diode mirror. The circuit operates from a $V_{CC}$ power supply connected + to terminal 10 and − to ground 11. A current sink 12 provides an $I_{IN}$ at input terminal 13. The input current is reflected as $I_{OUT}$ in load 14 which is connected to output terminal 15. $I_{IN}$ flows in transistor 16 which is forced to act as a diode by feedback transistor 17. Optional resistor 18 determines the current flowing in transistor 17. Since transistor 19 has its base-emitter circuit in parallel with that of transistor 16, conduction in transistor 19 is slaved to that in transistor 16. If transistors 16 and 19 are the same size, $I_{OUT}=I_{IN}$. If desired $I_{OUT}$ can be rationed to $I_{IN}$ by rationing the sizes of transistors 16 and 19. In practice transistor 19 is typically made up of a plurality of parallel-connected transistors. The collector output currents are related to $I_{IN}$ by the individual transistor sizes as related to transistor 16.

In the prior art, transistor 16 can be a PNP device with its base actually connected to its collector and omitting transistor 17. However this circuit, the basic PNP current mirror, suffers from poor accuracy. Accuracy is defined as the degree that $I_{OUT}=I_{IN}$. The accuracy for the basic PNP current mirror is normally regarded as poor, particularly when low Beta transistors are employed. The inclusion of transistor 17 as shown in FIG. 1 greatly improves the circuit accuracy and overcomes much of the poor performance attributed to low Beta transistors.

It can also be seen that if $I_{IN}$ is applied as a signal to terminal 13 the mirror will have to pass the signal as an amplifier so that the ability of the PNP transistors to pass high frequencies will be a limiting factor. It is well known that IC PNP lateral transistors have a greatly reduced maximum frequency capability with respect to the conventional NPN devices.

DESCRIPTION OF THE INVENTION

The block diagram of FIG. 2 shows the basic circuit of the invention. Where the elements are the same as those of FIG. 1 the same numbers are employed. The heart of the circuit is a differential amplifier (diff-amp) 21. Its inverting input is coupled to input terminal 13 and its output is coupled by way of resistor 22 to output terminal 15. Resistor 23 couples the output of diff-amp 21 to its inverting input. In operation the high gain of diff-amp 21 allows it to vary its output to a level which will force its input terminals to close to zero offset. This means that the potentials across resistors 22 and 23 will be equal and opposite. Since the op-amp has near zero input current, $I_{OUT}$ flows in resistor 22 and $I_{IN}$ flows in resistor 23 such that the current mirror gain will be equal to the ratio of resistors 22 and 23 and thus $$\frac{I_{OUT}}{I_{IN}} = \frac{R_{22}}{R_{23}}$$

For equal value resistors the current mirror gain will be unity. Thus a simple resistor ratio sets the mirror operating gain.

FIG. 3 is a schematic diagram of a circuit that performs the function of FIG. 2. Diff-amp 21 is composed of differentially connected transistors 25 and 26. Constant current device 27 sets the tail current. Constant current device 28, which operates at one half of the tail current, serves as the load for transistor 25. Emitter follower transistor 29 is the output stage which drives load 14 through resistor 22. The base of transistor 25 therefore provides the inverting amplifier input. This circuit acts in the manner described for FIG. 2.

FIG. 4 is a schematic diagram that shows an improved version of the circuit of FIG. 3. Where like parts are employed the same numbers are used. Constant current devices 27 and 28 are portrayed as transistors 27' and 28' which are respectively biased at $V_{BIAS2}$ and $V_{BIAS1}$. $V_{BIAS1}$ is close to one $V_{BE}$ below $V_{CC}$ and $V_{BIAS2}$ is close to one $V_{BE}$ above ground. The main difference is in resistors 22 and 23. They are made nonlinear as a function of current by breaking them up into three separate resistors labeled A, B and C with resistors B and C each shunted by a Schottky diode. In a typical case resistors A, B and C are respectively made 100 ohms, 1K ohms, and 10K ohms. At very low current values the resistor 22-23 values are 11.1K ohms each. As the current increases the voltage drop across the 10K resistor will rise until the shunt diode begins to conduct. Further current increases will flow substantially in the diode. This shunts out the C portion is that the overall value is then close to 1.1K ohms. At still higher currents the voltage across the 1K resistor will cause its shunt diode to conduct and any further increases will flow through the diodes. At this current level the resistor value close to 100 ohms. Even though the resistance varies drastically with current, if the diodes and the resistors are matched, between 22 and 23, the mirror gain will be unity at all currents. The nonlinear load will significantly extend the dynamic range of the mirror.

Schottky diodes are used so that minority carrier storage will not be a factor. If ordinary PN junction diodes were to be used, they would act as desired to short out the parallel resistor when the voltage drop causes them to conduct. However, if the current were to be quickly reduced the diodes would not immediately cease conduction but would continue to shunt the resistors until they could recover. Since it is intended to use the current mirror circuit at relatively high frequencies Schottky diodes (or an equivalent form of fast recovery diodes) must be used.

FIG. 5 is a schematic diagram of a current mirror circuit of the FIG. 4 variety used to drive a load 14 that contains a capacitor (which is shown in dashed outline). The capacitor voltage is to be ramped up or down in response to digital control signals. Again where parts are used that function in the manner of the previous figures the same numbers are used.

Diff-amp 21 is biased by tail current transistor 27'. Transistor 30 is operated as a diode which conducts the collector current of transistor 31. Transistor 31 in turn functions as a current mirror with diode connected transistor 32 so as to reflect the current flowing in resistor 33. Transistor 28', which also has its base-emitter circuit in parallel with diode connected transistor 32, will also mirror the current flowing in resistor 33. If transistors 28', 31 and 32 are matched and transistor 27' has twice the area of transistor 30, the current flowing in load transistor 28' will be one-half of the tail current. Both of these currents will be determined absolutely by the value of resistor 33 (and $V_{CC}$). Since resistor 33 can be made an off chip component, the IC user can program the Diff-amp bias current.

The current mirror, whose output is at terminal 15, can source output to the load so as to charge the capacitor with a constant current that will produce a rising voltage ramp. Transistor 34 when turned on can discharge the load capacitor and thereby produce a falling voltage ramp. Transistor 35 acts as the current mirror input sink at terminal 13. When transistor 34 is turned on transistor 35 is turned off so as to terminate the current mirror input at terminal 13. If transistors 34 and 35 are matched and biased to the same conduction level, the charge and discharge ramps will have the same slope.

Transistor 34 is controlled with Schottky switch 37 and transistor 35 is controlled with Schottky switch 36. These switches, when on, pull the related transistor 34 or 35 base low thereby turning if off. Schottky switches 36 and 37 are in turn controlled by logic signals applied respectively to terminals 38 and 39. When either terminal 38 or 39 is high the associated transistor 36 or 37 will be turned on thereby turning off the directly coupled transistors 35 or 34.

The on biasing for transistors 34 and 35 is set by a biasing network generally designated as 40 which operates as follows. Transistors 41 and 42 form a conducting pair between $V_{CC}$ and ground with the value of resistor 45 determining the current flowing in transistor 41. Resistors 46 and 47 determine the conduction in transistor 42. Transistor 41 is made to match transistors 34 and 35 so that current mirror action causes all three to conduct to the same extent when on. To complete the current mirror action transistors 43 and 44 are made to match transistor 42; resistors 46, 48 and 50 are made equal; and resistors 47, 49, and 51 are made equal. Resistor 45 can be made an off chip IC component that will program the conduction of both transistors 34 and 35 (when on) so as to control the charge and discharge ramp slopes of the load 14 capacitor.

The circuit of FIG. 5 can operate at a 25 MHz rate and can be used in phase-locked loop applications where the load capacitor can on the order of 100 pF. The higher operating frequencies require a higher operating current to charge and discharge the load capacitor. This means that a wide programmable dynamic current range is desirable.

The invention has been described and a detailed embodiment set forth. When a person skilled in the art reads the above description, alternatives and equivalents, within the spirit and intent of the invention, will become apparent. Accordingly it is intended that the scope of the invention be limited only by the following claims.

I claim:

1. A current mirror circuit for sourcing output current to a load element as a linear function of a current, coupled as an input to said circuit, said circuit comprising:
   a differential amplifier having inverting and non-inverting inputs and an output;
   first resistive means coupled between said differential amplifier output and said inverting input;
   second resistive means coupled between said differential amplifier output and said non-inverting input;
   means for coupling an input current to said inverting input;

means for coupling an output load to said non-inverting input; and means for making said first and second resistive means non-linear whereby the resistance is reduced as a function of increasing current.

2. The current mirror circuit of claim 1 wherein said differential amplifier comprises a pair of transistors having their emitters commonly coupled to a first constant current element and the collector of the inverting transistor of said pair having its collector coupled to a second constant current element and to an emitter follower output transistor.

3. The circuit of claim 2 wherein said first and second constant current elements are ratioed at 2:1 and are slaved to a common control current.

4. The circuit of claim 3 wherein all transistors, with the exception of said second constant current element, are NPN transistors.

5. The circuit of claim 1 where said first and second resistive means are each made up of a plurality of series connected resistors and all but one are shunted by diode means.

6. The circuit of claim 5 wherein said diode means comprise Schottky diodes.

* * * * *